United States Patent
Horch

(10) Patent No.: US 8,829,588 B2
(45) Date of Patent: Sep. 9, 2014

(54) NVM BITCELL WITH A REPLACEMENT CONTROL GATE AND ADDITIONAL FLOATING GATE

(75) Inventor: Andrew E. Horch, Seattle, WA (US)

(73) Assignee: Synopsys, Inc., Mountain View, CA (US)

(*) Notice: Subject to any disclaimer, the term of this patent is extended or adjusted under 35 U.S.C. 154(b) by 0 days.

(21) Appl. No.: 13/191,223

(22) Filed: Jul. 26, 2011

(65) Prior Publication Data

US 2013/0026553 A1 Jan. 31, 2013

(51) Int. Cl.
| | | |
|---|---|---|
| H01L 29/788 | (2006.01) | |
| H01L 29/51 | (2006.01) | |
| H01L 21/28 | (2006.01) | |

(52) U.S. Cl.
CPC .......... *H01L 29/513* (2013.01); *H01L 29/7881* (2013.01); *H01L 21/28273* (2013.01)
USPC ................. 257/316; 257/E21.422; 257/E29.3

(58) Field of Classification Search
USPC ................ 257/316, E21.422, E29.3; 438/257
See application file for complete search history.

(56) References Cited

U.S. PATENT DOCUMENTS

| | | | |
|---|---|---|---|
| 4,587,432 A | 5/1986 | Aitken | |
| 6,272,050 B1 * | 8/2001 | Cunningham et al. | ... 365/185.28 |
| 6,373,095 B1 * | 4/2002 | Bracchitta et al. | ............ 257/316 |
| 7,416,940 B1 * | 8/2008 | Torii et al. | ..................... 438/257 |
| 7,939,861 B2 | 5/2011 | Horch | |
| 2004/0070030 A1 | 4/2004 | Chindalore et al. | |
| 2005/0176200 A1 * | 8/2005 | Wang et al. | .................... 438/257 |
| 2005/0242388 A1 * | 11/2005 | Willer et al. | ................... 257/314 |
| 2006/0067128 A1 * | 3/2006 | Mihnea et al. | ........... 365/185.18 |
| 2006/0220106 A1 * | 10/2006 | Choi et al. | ..................... 257/324 |
| 2006/0246666 A1 * | 11/2006 | Han et al. | ....................... 438/263 |
| 2006/0284242 A1 * | 12/2006 | Jo | .................................. 257/316 |
| 2007/0025145 A1 | 2/2007 | Mokhlesi et al. | |
| 2008/0099830 A1 | 5/2008 | Lue et al. | |
| 2009/0146701 A1 * | 6/2009 | Noguchi et al. | ............. 327/144 |
| 2009/0152614 A1 * | 6/2009 | Hwang et al. | ................. 257/315 |
| 2009/0200598 A1 * | 8/2009 | Hsu et al. | ...................... 257/321 |
| 2010/0227460 A1 | 9/2010 | Wu et al. | |
| 2010/0252874 A1 * | 10/2010 | Schulz et al. | ................. 257/315 |
| 2011/0211394 A1 * | 9/2011 | Scheiper et al. | ......... 365/185.18 |
| 2012/0063233 A1 * | 3/2012 | Lee et al. | ................. 365/185.22 |
| 2012/0223318 A1 * | 9/2012 | Toh et al. | ........................ 257/76 |

OTHER PUBLICATIONS

Beug, M.F. et al., "Pitch Fragmentation Induced Odd/Even Effects in a 36 nm Floating Gate NAND Technology," 2008 $9^{th}$ Annual Non-Volatile Memory Technology Symposium, IEEE, Pacific Grove, CA, Nov. 11-14, 2008, pp. 1-5.

Depas, M. et al., "Soft Breakdown of Ultra-Thin Gate Oxide Layers," IEEE Transaction on Electron Devices, Sep. 1996, pp. 1499-1504, vol. 43, No. 9.

(Continued)

*Primary Examiner* — William F Kraig
*Assistant Examiner* — Khaja Ahmad
(74) *Attorney, Agent, or Firm* — Fenwick & West LLP

(57) ABSTRACT

Embodiments relate to a nonvolatile memory ("NVM") bitcell with a replacement metal control gate and an additional floating gate. The bitcell may be created using a standard complementary metal-oxide-semiconductor manufacturing processes ("CMOS processes") without any additional process steps, thereby reducing the cost and time associated with fabricating a semiconductor device incorporating the NVM bitcell.

25 Claims, 10 Drawing Sheets

(56) References Cited

OTHER PUBLICATIONS

Horch, A. et al., "Building Floating Gate NVM in a 1.0V/1.8V SOI Logic Process," Jan. 7, 2011, 5 pages.

Wolf, S., "Silicon Processing for the VLSI Era Volume 2—Process Integration" Lattice Press, 1990, p. 27.

PCT International Search Report and Written Opinion, PCT Application No. PCT/US12/47080, Oct. 5, 2012, 13 pages.

* cited by examiner

FIG. 8a – Prior Art

NVM BITCELL WITH A REPLACEMENT CONTROL GATE AND ADDITIONAL FLOATING GATE

BACKGROUND

1. Field of Art

This disclosure generally relates to the field of nonvolatile memory, particularly non volatile memory bitcell layouts.

2. Description of the Related Art

Nonvolatile memory (NVM) refers to memory that persistently stores information bits when not powered. A nonvolatile memory bitcell (NVM bitcell) stores a single bit of data. Some types of NVM bitcells are implemented using transistors with floating gates. The amount of charge residing on a floating gate determines whether the bitcell is storing a logical "1" or a logical "0". The floating gate is referred to as "floating" because the gate is electrically isolated from the surroundings by an oxide or dielectric. Some NVM can store more than one state in the bitcell.

In order to expand applications and reduce costs of memory devices, it is desirable to decrease the power and size requirements for NVM bitcells. One way of reducing the power and size requirements for an NVM bitcell is to reduce the thickness of the barrier between the bitcell floating gate and the bitcell channel that adds and removes charge from the floating gate. A thinner barrier allows for a smaller overall device, and lowers the amount of power required to change the logical state of the floating gate. Traditionally, NVM bitcells have consisted of a polysilicon or $Si_3N_4$ floating gate on top of a barrier of $SiO_2$, also called a gate oxide. In order to make a smaller device that draws less power, bitcell manufacturers have decreased the effective thickness of the gate oxide by replacing traditional $SiO_2$ gate oxides with higher dielectric constant (high-K) materials. Manufacturers of logic devices that do not need to store a state persistently can scale the gate oxide thickness more aggressively and change the material more easily than manufactures of NVM.

The high-K materials used as gate oxides contain traps. Traps are defects in the barrier that electrons can move in and out of Electrons are capable of moving from one trap to another if the traps are in close proximity. This trap hopping is called trap assisted leakage. Trap assisted leakage prevents long term data storage in an NVM bitcell. Even if there is a barrier that prevents electrons from leaking to another node, traps close to the floating gate can cause bitcells including a high-K barrier to experience a memory effect. The memory effect is caused when traps become filled with charge carriers transmitted through the barrier when charge is added or removed from the floating gate. When the floating gate is programmed to the opposite state, charge stored in the traps migrates back to the floating gate over time. This causes the floating gate to revert back or partially revert back to its prior state. If there are enough filled traps, the memory effect can become severe enough to make it difficult to maintain two different logical states (e.g., 0 and 1) on the bitcell. The memory effect can be compensated for by over-programming. However, over-programming can cause other problems such as causing the barrier dielectric to wear out, or the inability to perform future write operations.

With traditional gate oxide type barriers, the memory effect is not a significant problem, as gate oxides such as $SiO_2$ generally have very few traps. High-K materials, however, are trap rich, such that the memory effect is a significant problem. In addition to the memory effect problem, traps can cause other problems such as random telegraph noise (i.e., threshold voltage variation).

SUMMARY

Example embodiments include to a nonvolatile memory ("NVM") bitcell which has two oxide barriers, the first of which separates a logic floating gate from a high-K barrier and a replacement metal control gate. The second barrier separates the logic floating gate from a substrate. The bitcell has reduced power and size requirements, and does not experience significant memory effects characteristic of existing planar bitcells that use replacement metal gates and high-K barriers. The bitcell can be constructed using Complementary Metal-Oxide-Semiconductor (CMOS) logic processes of size 22 nanometers and below. The bitcell's design prevent memory effect problems, as well as problems caused by heat during the bitcell's creation. With additional process steps, the bitcell can be used to make embedded flash, magnetoresistive random access memory (MRAM), or ferroelectric random access memory.

In one example embodiment, the bitcell includes a substrate consisting of a source, a drain, and a channel region. A bottom barrier, for example a silicon dioxide barrier, sits above the channel region. A floating gate sits above the bottom barrier, and covers the channel region. A top barrier sits above the floating gate. A dielectric layer sits above the top barrier. The dielectric layer consists of a material with a dielectric constant that is higher than that of the top barrier. The dielectric layer contains a dialectic material that contains significantly more traps than SiO2. The dielectric layer covers the top barrier and extends past the floating gate, thereby at least partially surrounding the top barrier, the bottom barrier, and the floating gate. A control gate sits above at least a portion of the dielectric layer. The control gate also at least partially surrounds the top barrier, the bottom barrier, and the floating gate.

BRIEF DESCRIPTION OF DRAWINGS

FIG. 8a illustrates a conventional flash memory device.

DETAILED DESCRIPTION

Embodiments relate to a nonvolatile memory ("NVM") bitcell with a replacement metal control gate and an additional floating gate. The bitcell may be created using a standard complementary metal-oxide-semiconductor manufacturing processes ("CMOS processes"), where all high heat steps are performed prior to logic devices made such that the additional heat does not affect the logic devices.

"NVM bitcell," "bitcell" or "bit" described herein refers to CMOS type (i.e., transistor based) nonvolatile memory. A CMOS NVM bitcell is distinguishes from other types of NVM memory such as magnetic memory, such as is found in floppy disks, or optical memory such as is found in CDs or DVDs. NVM bitcells are produced using a CMOS process that includes a number of process steps in a fabrication facility (fab).

Figure 1A:
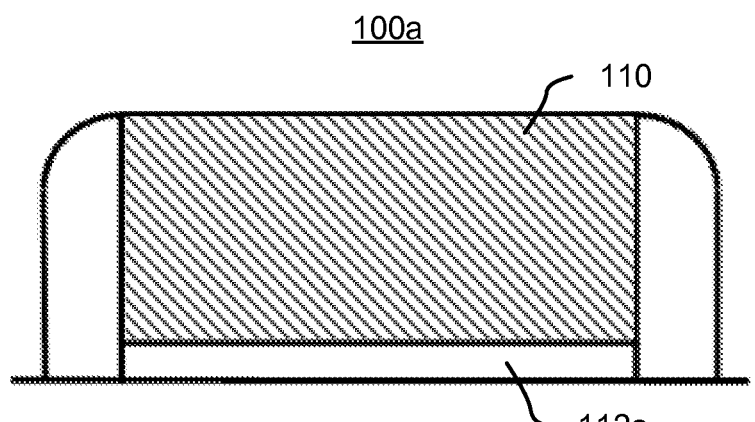
FIGS. 1a and 1b are simplified, cross sectional diagrams of conventional NVM bitcells.

FIG. 1a is a simplified cross sectional diagram of one example of a conventional CMOS logic device. CMOS logic devices with gate oxides thick enough to retain charge can be used for floating gate NVM bitcells. The logic device 100a of FIG. 1a includes a gate stack consisting of a conduction gate material that can be used as a floating gate 110 which stores charge transmitted through a barrier 112a. Floating gates 110 are commonly made of polysilicon, and barriers 112a are commonly made of $SiO_2$, and may be referred to as "gate oxides."

Figure 1B:
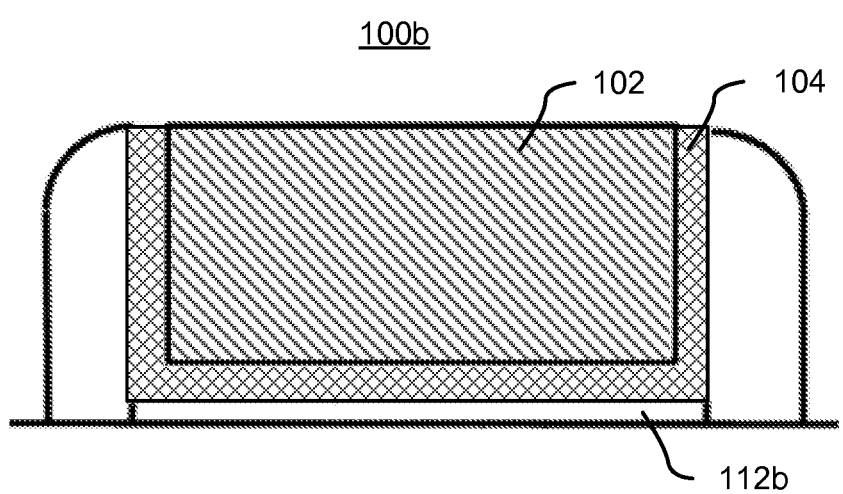

FIG. 1b is a simplified cross sectional diagram of another example of a conventional CMOS logic device with a high-K dielectric stack and a metal gate formed using a gate replacement process. The device 100b of FIG. 1b includes a gate stack consisting of a metal gate 102 a high-K dielectric barrier 104. In some cases, an additional pedestal oxide 112b is present to prevent mobility loss in the channel region due to surface scattering and to facilitate easier construction of the device. The bitcell 100b can be constructed using either a gate first process or a gate last process. It is challenging to construct a floating gate NVM bitcell as exemplified in FIG. 1b. The high-K dielectric is in direct contact with the floating gate. This will result in a large memory effect. If the SiO2 layer 112b is not thick enough there will also be trap assisted leakage to the substrate.

Figure 2A:
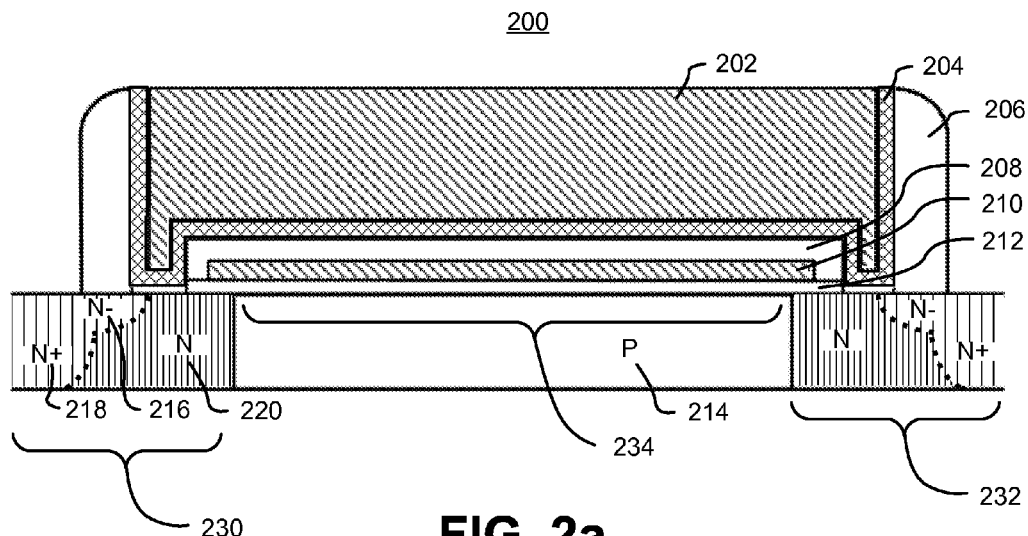
FIGS. 2a and 2b are perpendicular cross sectional diagrams of a silicon on insulator (SOI) type NVM bitcell according to one embodiment.
Figure 2B:
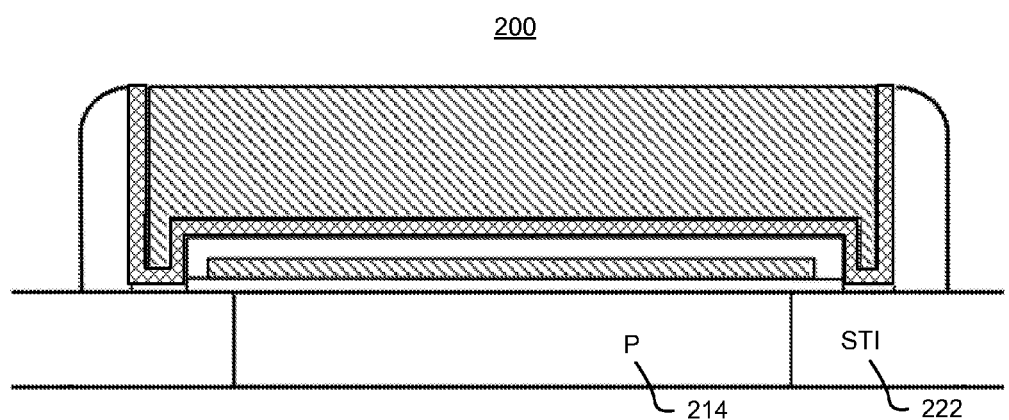

FIGS. 2a and 2b are perpendicular cross sectional diagrams of a silicon on insulator (SOI) type NVM bitcell 200 according to one embodiment. The bitcell 200 is embodied as an N-type floating gate MOSFET. The bitcell 200 may also be constructed as P-type floating gate MOSFET. FIG. 2a illustrates a cross section of a NVM bitcell 200 in a direction parallel to the flow of current through the channel of the bitcell 200. The floating gate stack of the bitcell 200 includes a control gate 202 enclosing a polysilicon floating gate 210 on at least three sides, such that the control gate 202 and the floating gate 210 are substantially centered over the channel region 234. In some cases, the control gate 202 is thicker than the floating gate. 210 On the outside of the floating gate stack may be spacers 206 made of an oxide or other nonconductive material.

In between the control gate 202 and the floating gate 210 are a layer of material with a high dielectric constant (a high-K) 204 and a top barrier 208 of non-conductive material, such as SiO2. The top barrier 208 may also be referred to as the top oxide layer. The layers are arranged such that the high-K layer 204 is located between to the control gate 202 and the top oxide layer 208, and the top oxide layer 208 is located between the high-K layer 204 and the floating gate 210. A bottom barrier 212 is located in between the floating gate 210 and the substrate of silicon forming the rest of the bitcell 200. The bottom barrier 212 may also be made of SiO2, and may be referred to as the bottom oxide layer. In both the top and bottom oxide layers, materials other than SiO2 may be used, as long as the materials have a relatively low number of charge carrier traps. The barriers 208 and 212 have few traps relative to the number of traps present in the high-K layer 204. The barriers 208 and 212 generally will have a low dielectric constant compared to the high-K layer 204. Each of the barriers 208 and 212 is at least 43 Angstroms thick, and may be as thick as 200 Angstroms. Sixty Angstroms is a typical thickness of barriers 208 and 212.

Beneath the bottom oxide layer 212, a silicon substrate is located on top of an insulator (not shown). The bitcell 200 is a silicon on insulator (SOI) type construction. The insulator may be a buried oxide layer (not shown), for example. The substrate includes a P-type body region 214 underneath the floating gate 210. The floating gate 210 and the bottom barrier 212 extend beyond the length of the P-type body region 214. When the device is activated, a channel region 234 is formed in the portion of the P-type region immediately beneath the bottom barrier 212 in between the source 230 and drain 232 regions. The size of the channel region 234 is characterized by the flow of carriers between the source 230 and drain 232 regions depending upon the voltage at the source 230, drain 232, the charge on the floating gate 210, the charge on the control gate 202, and the dopings/implants of the source 230 and drain 232.

The substrate also includes the N-type body regions 220 which encompass the source 230 and the drain 232. N-type body regions 220 extend partway underneath floating gate 210 and the bottom barrier 212. The N-type body regions 220 also extends underneath the portion of the control gate 202 and the high-K layer which surrounds the floating gate 210. The N-type body regions 220 also extend past the edges of the spacers 206. The N-type body regions 220 have a base amount of doped/implanted charge carriers of opposite polarity (or conductivity type) to the P-type body region 214 in order to reduce the resistance between the source 230 or drain 232 and the channel region 234. In processes where there is a gap between the floating gate 210 and the source/drain regions 230, 232, the process includes implant steps to electrically connect the source/drain regions 230, 232 and the channel region 234 under the floating gate 210. In one case, N-type body regions 220 may be used. Both P-Body and N-Body regions 220 may be doped in the range of 1017 to 1018 atoms per cubic centimeter.

The N-type body regions also include additional implants of electrons that form the source 230 and the drain 232. The source and drain both include a lightly doped drain (LDD) region 218. The LDD region 218 has the highest dopant concentration at or very close to the surface of the N-type body region, and drops further into the well. The amount of the LDD doping 218 is on the order of $10^{19}$ charge carriers per cubic centimeter. The LDD regions 218 extend partway underneath the spacers 206 which border the control gate 202 and high-K material 204.

Additional LDD regions 216 are also formed in the N-type regions at both the source and the drain through additional implants of charge carriers (in this version electrons). The amount of the LDD doping 216 is approximately on the order of $10^{19}$-$10^{20}$ charge carriers per cubic centimeter. The LDD regions 216 are located adjacent to the other LDD regions 218. The LDD regions 216 extend partway underneath the portion of the control gate 202 and high-K layer 204 which surrounds the floating gate 210. In bitcell 200, the LDD regions 216 do not extend underneath the floating gate region 210, nor do they extend to the border between the N-type body region 220 and the P-type body region 214.

If the process has a halo implant at part of the LDD that prevents the LDD regions from contacting the N-Body region 220, then the halo implant is blocked.

FIG. 2b illustrates a cross section of a NVM bitcell 200 in a direction perpendicular to the current flow in channel of the bitcell 200. In the perpendicular direction, the P-type body region 214 is bordered on both sides by a shallow trench isolation (STI) 222. The STI 222 prevents leakage of current between bitcells 200 where multiple bitcells 200 are placed in close proximity to form a multi-bit memory device.

In those areas of the bitcell 200 where the control gate 202 couples to the floating gate 210 over the STI 222, the control gate 202 to floating gate 210 capacitance is increased without increasing the floating gate 210 to substrate (e.g., the P-type region 214, source 230, and drain 232). Thus, increasing the surface area of the overlap between the control gate 202 and the floating gate 210 over the STI 222, increases the floating gate 210 to control gate 202 capacitance. Similarly, decreasing the surface area of the overlap between the control gate 202 and the floating gate 210 decreases the floating gate 210 to control gate 202 capacitance. The capacitance may be anywhere between 0 and very close to 100%.

In an NVM device, a memory block encompasses many bitcells of memory. The memory block often includes a mechanism to control which bit is to be written, read, or erased in order to distinguish each bit from the other bitcells in the block. In some cases, the control mechanism is implemented within each bit of memory. Implementing a control mechanism for each bit allows for read, write and erase control over each individual bit. The bitcell 200 incorporates a control mechanism in the form of control gate 202.

The control gate 202 can be used to write or erase the floating gate 210 by moving charge on or off the floating gate 202. The greater the capacitance between the floating gate 210 and the control gate 202, the more closely the control gate 202 and floating gate 210 will be coupled, such that the voltage on the floating gate 210 will more closely track the voltage on the control gate 202. If the floating gate starts at 0 volts (V), control gate 202 is brought to a high voltage, for example 9V, and the source 230 and drain 232 of the bitcell 200 are held at 0V, assuming an 80% coupling ratio from floating gate to control gate, the floating gate will be coupled up to 7.2V. With a 7.2V difference between the floating gate and the substrate, electrons may be move through the gate oxide by one or more simultaneous transport mechanisms, thereby causing the floating gate voltage to drop. Transport mechanisms such as Fowler-Nordheim (FN) tunneling, channel hot injection (CHI), impact ionized hot electron injection (IHEI), or band to band tunneling (BTBT).

The control gate 202 can be used to read the charge on the floating gate 210. The control gate 202 is set to read voltage, for example 0V or 1V. A voltage is applied to the source 230 and the drain 232 to have voltage drop between the source and the drain, if the floating gate has a voltage that is slightly more than the $V_T$ of the bitcell 200 then a channel 234 from source to drain will form. If the floating gate voltage is less than a $V_T$, the channel 234 will not form. The channel 234 will pass a current between the source 230 and the drain 232 if the floating gate 210 is in a first logical state (e.g., 1 or logic high), and will pass no current if it is in a second logical state (e.g., 0 or logic low).

Figure 3:
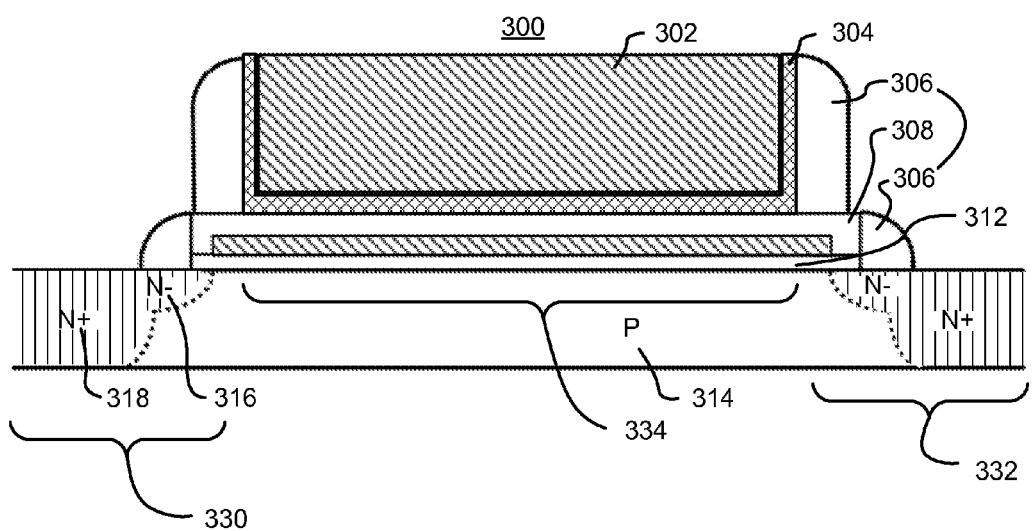
FIG. 3 is a cross sectional diagram of a Silicon on Insulator (SOI) type NVM bitcell according to another embodiment.

FIG. 3 is a cross sectional diagram of a Silicon On Insulator (SOI) type NVM bitcell according to another embodiment. As with bitcell 200, bitcell 300 is embodied as an N-Type floating gate MOSFET using a SOI construction. The bitcell 300 may also be constructed as P-Type floating gate MOSFET. FIG. 3 illustrates a cross section of the NVM bitcell 300 in a direction parallel to the current flow in the channel of the bitcell 300. In this case, the bitcell 300 has largely the same elements as bitcell 200. However, the bitcell 300 differs significantly in the size and shape of those elements.

The floating gate stack of the bitcell 300 includes a metal control gate 302 that sits on top of a polysilicon floating gate 310. In contrast to the control gate 202 of bitcell 200, the control gate of 302 of bitcell 300 does not surround the floating gate 310. The control gate 302 is either as long as the floating gate 310, or narrower than the floating gate 310 in the direction of the channel region 334. The control gate 302 and the floating gate 310 are substantially centered over the channel region 334. On the outside of the floating gate stack are spacers 306.

As in bitcell 200, in bitcell 300 there is a high-K 304, a top barrier of non-conductive material 308, and a bottom barrier 312. These layers are generally arranged in the same manner, vertically, as in bitcell 200 with respect to those portions of the layers located over the channel region 334. In contrast to bitcell 200, however, in bitcell 300 the length and shape of these layers is different owing to the fact that the control gate 304 does not surround the floating gate 310. In bitcell 300, the high-K layer 304 does not surround the floating gate 310. The high-K layer 304 lines the control gate 302. The top 308 and bottom 312 barriers extend the length of the floating gate 310, and may extend underneath the top portion of the spacer 306 surrounding the control gate 302 and high-K layer 304. Since both the spacers 306 and the barriers 308 and 312 are formed of nonconductive material, the exact arrangement and construction of spacers may vary. The bottom portion of the spacer 306 located in plane with the floating gate 310 and barriers 308 and 312 may extend further over the P-type body region 314 than the top portion of the spacer 306.

Bitcell 300 has a P-type body region 314. When the device is activated, a channel region 334 is formed in the portion of the P-type region 314 immediately beneath the bottom barrier 312 in between the source 330 and drain 332 regions. Bitcell 300 does not have N-type body regions located at the source and the drain. Instead, the source 330 and drain 332 are formed through doping the P-type body region 314 with charge carriers of opposite polarity (or conductivity type) from the P-type body region 314. The source and drain both include a lightly doped drain (LDD) region 318 doped with electrons. The amount of the LDD doping 318 is on the order of $10^{19}$ charge carriers per cubic centimeter. The LDD regions 318 extend a limited distance beneath the spacers 306 which border the floating gate 310. The LDD regions 318 are symmetric with respect to the floating gate 310.

Additional LDD regions 316 are located adjacent to the LDD regions 318. In contrast to the LDD implants 318, the LDD regions 316 are symmetric with respect to the control gate 302. The LDD regions 316 extend underneath the spacers 306, and extend partway underneath the floating gate 310. As a result, the source 330 and drain 332 generally, extend underneath the floating gate 310.

Halo regions (not shown) might be formed next to the LDD implants at both the source 330 and the drain 332 through additional dopings of p-type dopants.

Figure 4:
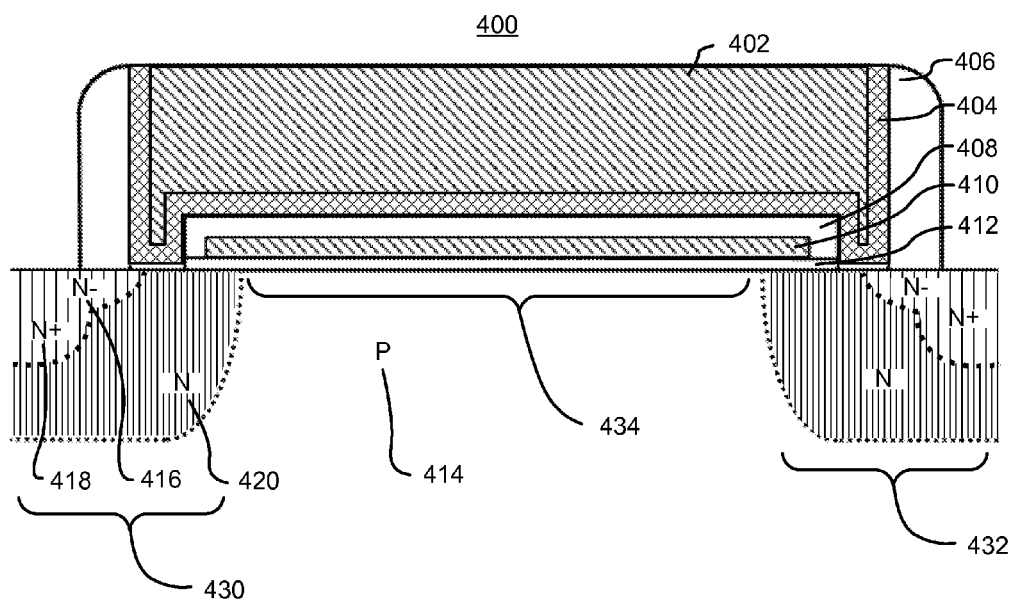
FIG. 4 is a cross sectional diagram of a bulk silicon type NVM bitcell, according to one embodiment.

FIG. 4 is an example of a cross sectional diagram of a bulk silicon type NVM bitcell, according to one embodiment. The bitcell 400 is embodied as an N-type floating gate MOSFET. The bitcell 400 may also be constructed as P-Type floating gate MOSFET. FIG. 4 illustrates a cross section of a NVM bitcell 400 in a direction parallel to the channel 434 of the bitcell 400. The example bitcell 400 of FIG. 4 has a similar structure to the bitcell 200 of FIG. 2.

Bitcell 400 is constructed using bulk silicon instead SOI. Thus, the channel region 434 of the bitcell 400 sits in a bulk P-type silicon substrate 414. The source 430 and drain 432, rather than being formed in N-type body regions, are formed in N-wells 420 created by doping the P-well 414 substrate with additional N-type dopants. The N-wells generally have a concentration of $10^{17}$ dopant atoms per cubic centimeter. The LDD implants 418 are aligned to the control gate 402. In one embodiment, the LDD implant regions are self aligned to the control gate and the control gate is not self aligned to the floating gate. One or more well implants, for example halo implants or a $V_T$ adjustment implant (not shown), is used to adjust the $V_T$ of the device.

Figure 5:
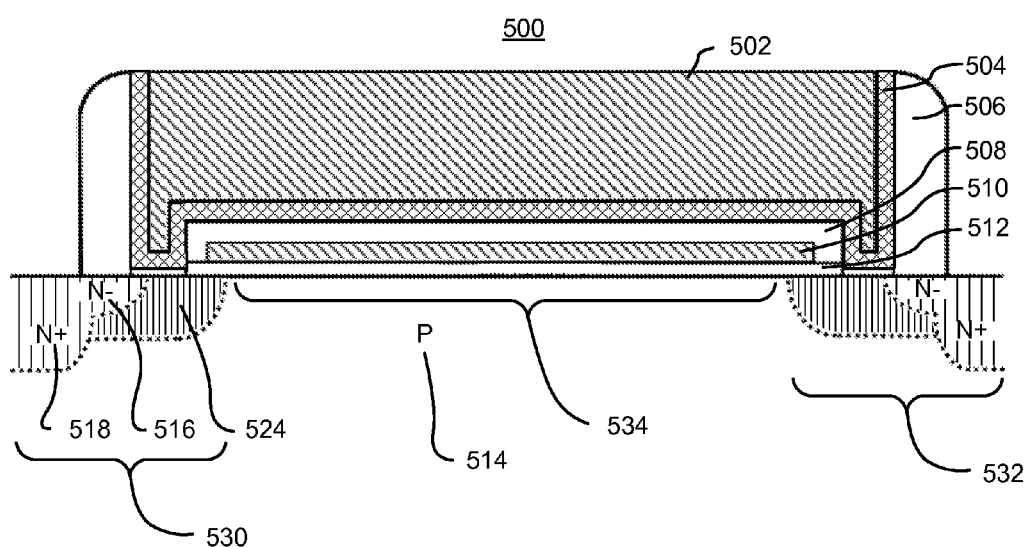
FIG. 5 is a cross sectional diagram of a bulk silicon type NVM bitcell, according to another embodiment.

FIG. 5 is an example of a cross sectional diagram of a bulk silicon type NVM bitcell, according to another embodiment. The example bitcell 500 of FIG. 5 has a similar layout of gate stack components as the bitcell 400 of FIG. 4, and is similarly built on bulk silicon rather than SOI. The bitcell of FIG. 5, however, has a smaller size than the bitcell 400 of FIG. 4, due to differences in the doping that couple the source 530 and drain 532 to the channel 534.

The bitcell 500 includes an additional doping threshold voltage adjustment implant 524 ($V_T$ adjustment implant) that is implanted in the P-well substrate 514 prior to the addition control gate 502 or the spacers 506. The $V_T$ adjustment implant 524 comprises a doping of additional p-type dopant atoms, where the charge concentration is on the order of $10^{17}$ charge carriers per cubic centimeter. The $V_T$ adjustment implant 524 extends underneath the portion of the control gate 502 and high-K layer 504 surrounding the floating gate 510. The $V_T$ adjustment implant 524 also extends past the edge of the floating gate 510. The $V_T$ adjustment implant 524 helps extend the reach of the source 530 and drain 532 underneath the floating gate.

Figure 6:
FIG. 6 is a flow chart of a CMOS process to produce the NVM bitcell of FIGS. 2a and 2b, according to one embodiment.

The process by which the bitcell is constructed may vary. The bitcell may be produced using either a gate-first or a gate-last process, where the "gate" referred to is the control gate. The order in which process steps occur may also vary depending upon the sensitivity of the desired ion implantations to heat, which affects when the floating gate is added to the bitcell during the process. FIG. 6 is a flow chart of a CMOS process to produce the NVM bitcell of FIGS. 2a and 2b, according to one embodiment. FIGS. 7a through 7h illustrate the construction of the NVM bitcell of FIGS. 2a and 2b, according to one embodiment. The process described with respect to FIG. 6 is illustrated in FIG. 7. Whether the starting wafer is SOI or bulk determines if the end devices are SOI or bulk devices. The steps for the SOI case are similar to the steps for a bulk silicon case.

A shallow trench isolation is formed 602 in a silicon wafer to isolate the active surface region from other nearby active regions. The shallow trench isolation may be formed 602 by depositing an oxide layer and a nitride layer, developing a photo resist, and etching the oxide layer, the nitride layer and the silicon wafer.

A bottom barrier 212 is formed 604 on the silicon wafer, partially over the area of the shallow trench isolation, and covering the silicon wafer substrate. The bottom barrier 212 is formed of a non-conductive material that has relatively few traps, such as silicon dioxide ($SiO_2$). The bottom barrier 212 may be referred to as the sacrificial oxide layer, or Sac-Ox layer, owing to the fact that it is normally removed prior to the addition of the high-K layer 204 and the metal replacement gate 202. Normally the Sac-Ox layer is added in order to prevent impurities, such as metal ions, from entering the substrate during ion implantation and other harmful steps of the bitcell creation process. However, in bitcell 200 the bottom barrier 212 is not removed, and instead functions as barrier between the floating gate 210 and substrate 214, isolating the floating gate 210 from the substrate 214.

A floating gate 210 is deposited 606 on the bottom barrier 212. The floating gate 210 may be made of polysilicon, $Si_3N_4$, or another similar semi-conductive or conductive material. The floating gate 210 is then etched 608 into the desired shape (e.g., length, width, or any additional shape characteristics).

Figure 7A:
FIGS. 7a through 7h illustrate the construction of the NVM bitcell of FIGS. 2a and 2b, according to one embodiment.

FIG. 7a illustrates an example of a formed floating gate 210 and bottom barrier 212. The STI 222 is not shown in FIG. 7a.

Figure 7B:

A top barrier 208 is then formed 610 on top of the floating gate 210. The top barrier 208 may be formed 610 in a different manner depending upon the material that makes up the floating gate 210. For example, the top barrier 208 may be formed 610 by oxidization if the floating gate is made of polysilicon, or deposited if the floating gate is made of $Si_3N_4$. FIG. 7b illustrates a top barrier 208 after formation.

Figure 7C:
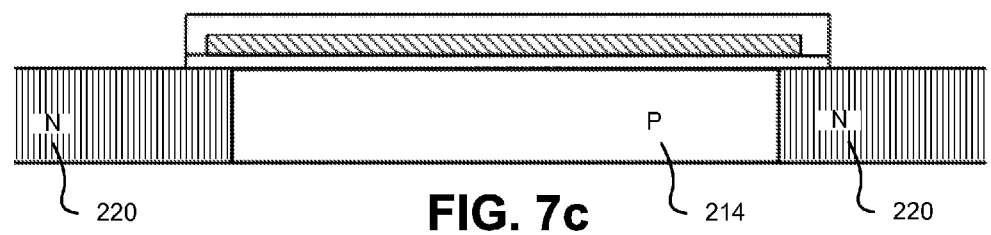

P-type 214 and N-type 220 body regions are formed 612 in the silicon substrate through ion implantation. If a bulk process is used, P-Well 414 and N-Well 420 regions are formed instead of body regions. FIG. 7c illustrates an example of a N-type body regions 220 and P-type body regions 214 after formation for the SOI process. The P-type 214 and N-type 220 body regions may be formed in the substrate before or after the creation of the top barrier 208, bottom barrier 212, or floating gate 210. The creation of the P-type region 214 forms the area where a channel 234 will be created when the transistor of the bitcell is in an "on" state such that current is flowing from the source 230 to the drain 232. The N-type regions 220 are the locations of the source 230 and the drain 232.

In some cases, it is advantageous to form the barriers 208 and 212 and floating gate 210 before the implanting the P-type 214 and N-type 220 regions. This is preferable where ion implantations forming the P-type and N-type regions are sensitive to heat. When ion implantations are subjected to high heat unwanted ion diffusion can occur. The creation of the floating gate 210 can cause the substrate to subjected to a great deal of heat. If the floating gate 210 is formed prior to the ion implantations forming the P-type and N-type regions, then the implantations of the P-type and N-type regions are not subjected to the heat from the creation of the floating gate.

In some cases it is advantageous to form the N-type 220 and P-type 214 regions before the floating gate 210 or barriers 208 and 212 are added to the bitcell. This is preferable where the ion implantations forming the P-type and N-type regions are relatively insensitive to heat. Although the ion implantations are capable of penetrating the barrier layers 208 and 212 and floating gate 210 to implant into the substrate, some ions are usually left behind in the process. By forming the N-type and P-type regions before the formation of the barriers 208 and 212 and floating gate 210, leftover ions will not be implanted into the barriers and 208 and 212 and floating gate 210. Implanting first thus prevents any unnecessary contamination of the barriers or floating gate.

Figure 7D:
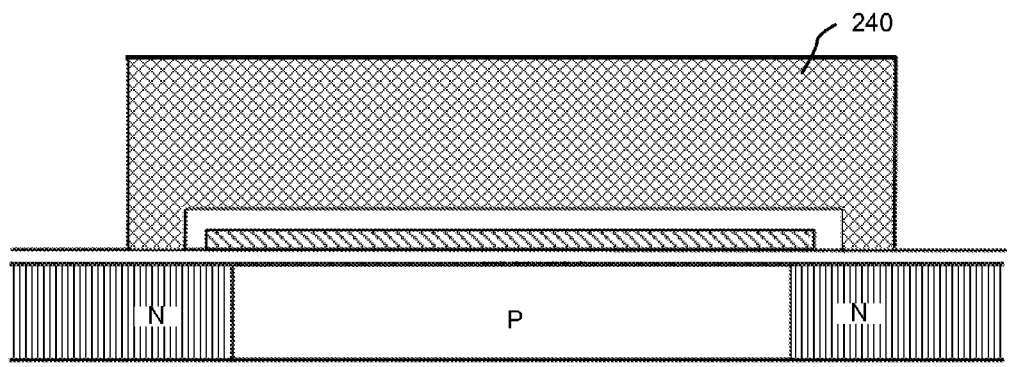

A sacrificial gate 240 is added 614 on the top of the top barrier 208. The sacrificial gate is typically made of a material that is easy to add and remove, for example germanium. The sacrificial gate 240 surrounds the top barrier 208, and at the outer edges sits on top of the bottom barrier 212. FIG. 7d illustrates an example of the sacrificial gate 240 after formation.

Figure 7E:
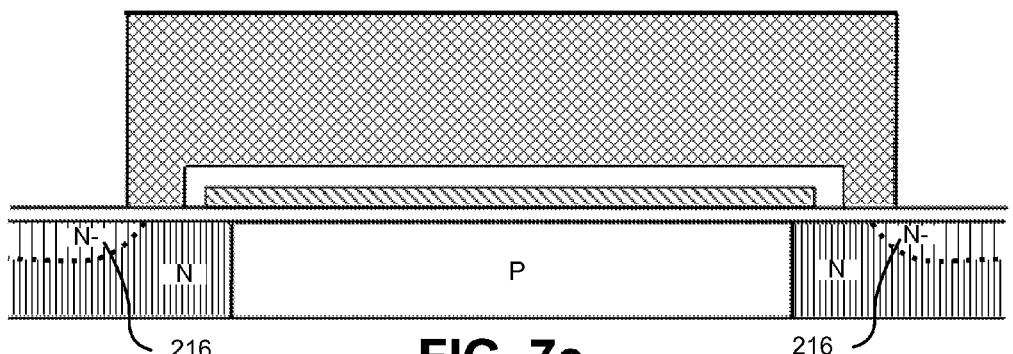
Figure 7F:
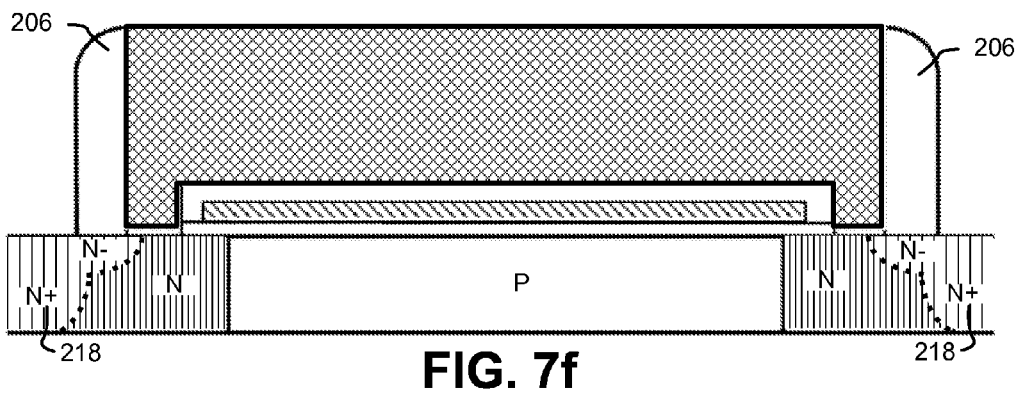

The LDD regions 216 are implanted 616 into the N-type regions 220 through ion implantation. FIG. 7e illustrates an example of the bitcell 200 after the LDD regions 216 have been implanted into the N-type regions 220. Spacers 206 are added to the side of the sacrificial gate 204. The addition of the spacers may also include etching which can remove some of the bottom barrier 212. In some cases, the spacers 206 may rest on the bottom barrier 212. In other cases, the spacers 206 may rest on the substrate. The LDD regions 218 are implanted 616 into the N-type regions 220 through ion implantation. The width of the spacers 206 affects how far the implanted charge carriers penetrate into the silicon substrate. FIG. 7f illustrates the bitcell 200 after the further LDD regions 218 have been implanted in the N-type regions 220.

Figure 7G:
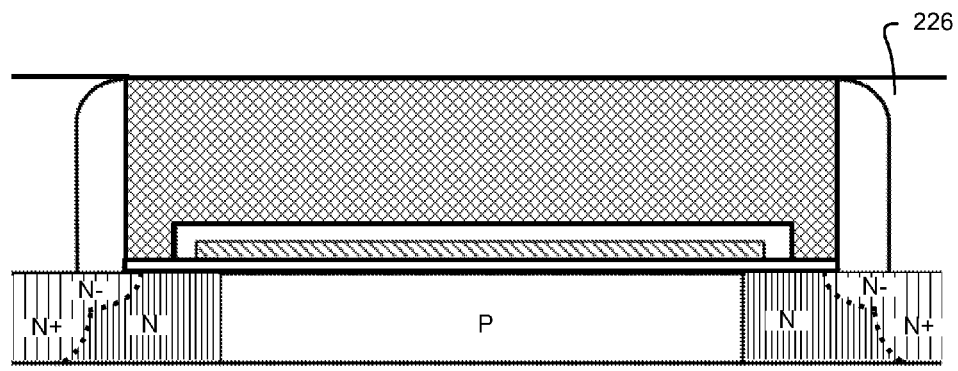

An oxide 226 is added to surround the sacrificial gate 240. FIG. 7g illustrates the bitcell 200 after oxide 226 has been added.

Figure 7H:
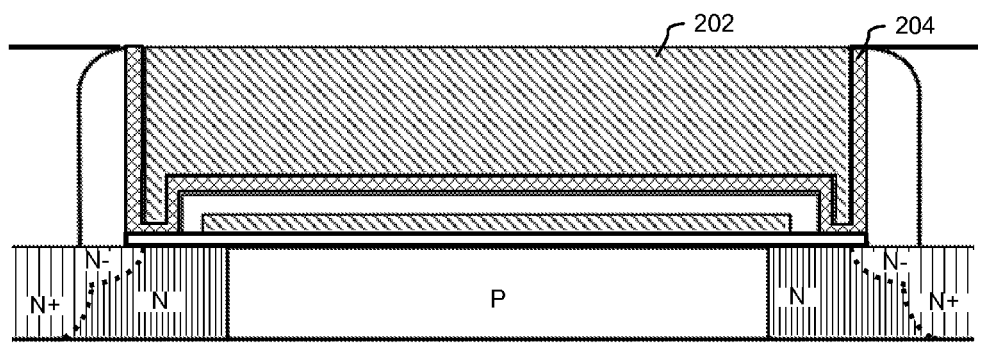

The sacrificial gate 240 is removed 618. A photolithography step (not shown) is added prior to the removal of the sacrificial gate 240 to prevent the top barrier 208 from being removed when the sacrificial gate 240 is removed. A pedestal oxide (or top barrier) is formed. If the process has logic devices that operate at different voltages a thicker top barrier is formed for use in the higher voltage device. A high-K layer 204 is added 620 on the same surface the sacrificial gate 240 was removed from. A metal gate 202 is added 622 on top of the high-K layer 204 in the remainder of the space that was previously occupied by the sacrificial gate. It is said the metal gate replaces the sacrificial gate. FIG. 7h illustrates bitcell 200 after the control gate 202 and high-K layer have been added, replacing most of the sacrificial gate, except for high-K layer 204.

In another version of the process (not shown) for generating the bitcell, the addition of the floating gate 210, the top barrier 208, and the bottom barrier 212 can be delayed until after all ion implantations have been completed. The shallow trench isolation is formed in the substrate. Masks are used to implant the body regions 214 and 220, as well as to implant the halo regions 216, LDD regions 218, and any VT adjustment implants. In conjunction with masking, one or more of the implants can be added after adding sacrificial gate 240 and spacers 206 to help define the regions of the substrate where the implants will add charge carriers.

Once all implants are completed, the sacrificial gate 240 may be removed. Bottom barrier 212, floating gate 210, and top barrier 208 are added as described above with respect to FIG. 6. The high-K layer 204 and the replacement metal gate 202 are then added.

FIG. 8a illustrates a conventional flash memory device. In conventional flash memory devices 800a, a bitcell 860a is used to store a piece of data, for example a logical 1 or 0. A second device, referred to as a logical device 850a, is used to select the row to be read, if the bitcell 860a is to be used in a conjunction with many other similar bitcells 860. The logical device is also referred to as a select device, and operates by electrically isolating one row of bitcells 860 from another. The word line control gate 802a has a voltage applied to it when the charge on the flash floating gate 810a is to be read. The channel of the bitcell 860a will activate or not activate when the voltage is applied to the control gate 802a depending upon the amount of charge on the floating gate 810a. In a flash memory bitcell, the control gate 802a is self aligned to the floating gate 810a.

Although flash uses a high-K dielectric layer 804a to isolate the control gate 802a from the floating gate 810a, flash does not use a high-K dielectric layer to isolate the select gate 852a of the logical device 850a from the substrate. Instead, logical devices 850a consist of a conventional $SiO_2$ gate oxide 854a.

To minimize bitcell size, flash bitcells make the gate stack 860a comparatively tall to maximize side wall capacitive coupling to the floating gate. In contrast, in bitcell 200 the gate stack height is minimized to keep the stack height approximately the same as the logic devices. Having a comparatively short gate stack height compared to flash type bitcells avoids the necessity to modify the process due to topological problems caused by increasing the gate stack height.

Figure 8B:
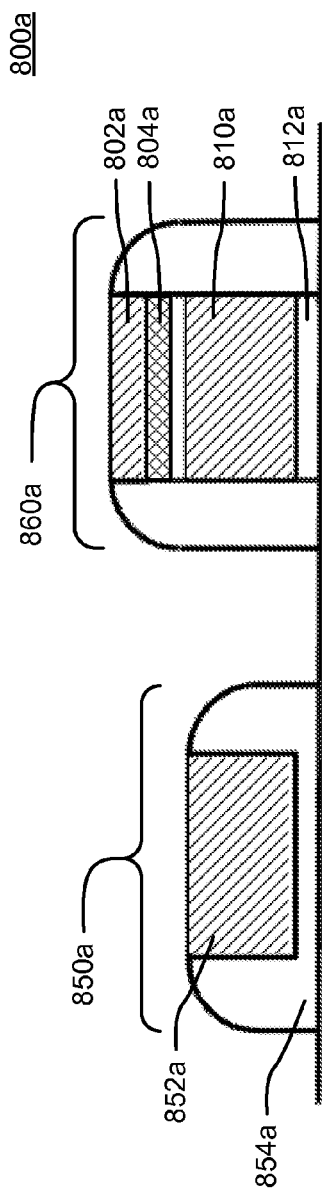
FIG. 8b illustrates a memory device, according to one embodiment.
Figure 8B:
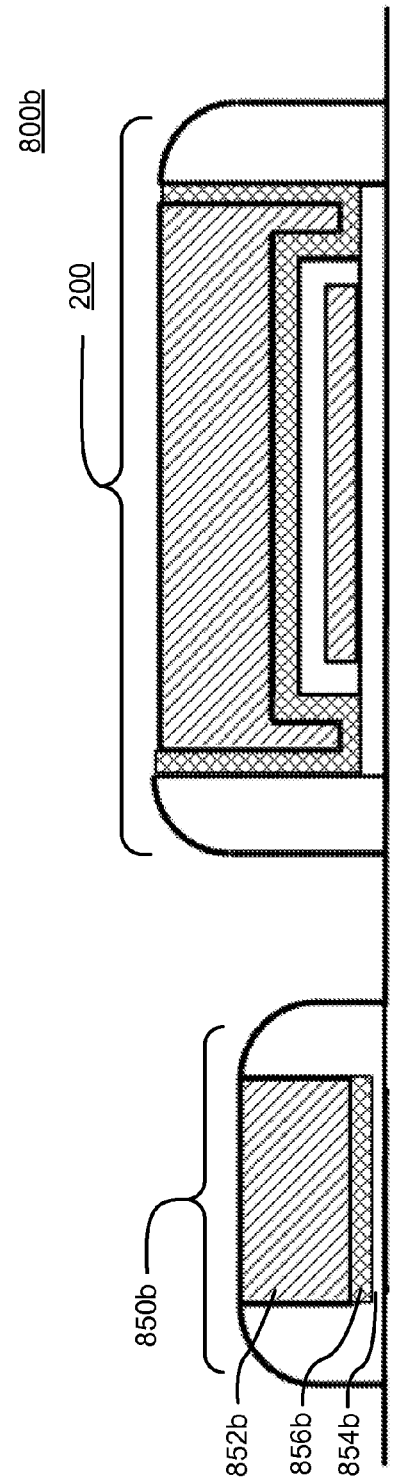

FIG. 8b illustrates a memory device, according to one example embodiment. In a memory device 800b, a bitcell 200 is used to store a piece of data, for example a logical 1 or 0. A logical device 850b acts as a select device. The logical device 850 includes a select gate 852a. The select gate 852a is isolated from substrate and a channel region (not shown) that is different from the channel region 234 of bitcell 200, by a high-K layer 856b and a barrier 854b. The high-K layer 856b is located in between the select gate 852b and the barrier 854b. The barrier 854b is located between the high-K layer 856b and the substrate. The logical device can be created along with the bitcell 200 using no additional process steps in the CMOS logic process. In one embodiment, the high-k dielectric in the NVM cell is also used in a MOSFET where the MOSFET has a maximum operating voltage below 1.5V.

Additional Considerations

The disclosed embodiments beneficially allow for a NVM bitcell that has reduced power and size requirements. The bitcell has reduced power and size requirements because it can be produced using a 22 nm and smaller CMOS logic process for construction. Further, the bitcell negates the harmful effects of gate-last processes involving replacement metal gates and high-K dielectric barriers. The addition of an extra logic floating and additional layer of oxide covering the new floating gate prevents problems with the bitcell that occur in existing technologies due to the heat of the process steps affecting the logic device. The extra oxide layer is formed at a point in the process so that heat does not affect the performance of other devices in the process.

Further, the bitcell avoids memory effect problems that plague existing bitcells that use replacement metal control gates, separated from the transistor channel by high-K barriers. In the bitcell, the replacement metal gate serves as a control gate for controlling the voltage on a separate logic floating gate, rather than acting as a logic gate itself. The memory effect does not come into play because the control gate is always held at a voltage, and thus the memory effect does not affect the control gate. Further, the floating gate carrying the logical value is isolated from the high-K layer by a barrier of oxide, preventing charge from reverting the logic state of the floating gate.

The bitcell has wide applicability. For example, the bitcell may be used as an alternative to expensive flash memory. Flash memory is expensive because it requires a number of additional process steps to create that are not part of the standard CMOS logic process and it adds a significant amount of heat. In contrast, the bitcell can be constructed using the existing CMOS logic process with fewer additional steps. Further, due to the differences in the bitcell, any associated logic devices used to implement flash-like memory on the same substrate can also have a more advantageous construction, for example incorporating high-K layers into the logic device.

Flash memory is characterized by a high amount of floating gate to control gate capacitance (e.g., 70% capacitance). Much of this capacitance is on the side wall of the floating gate, which results in a tall gate stack that cannot be easily incorporated with high performance high-K metal gate transistors. In contrast, because the bitcells of the present description can create high amounts of control gate to floating gate capacitance (e.g., 70% or higher or lower) by increasing the surface area of the floating gate and the control gate located over the shallow trench isolation. Thus, the present bitcells can achieve flash-like capacitances without making a tall gate stack.

Upon reading this disclosure, those of skill in the art will appreciate still additional alternative structural and functional designs through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A non-volatile memory bitcell comprising:
    a substrate comprising a source, a drain, and a channel region;
    a nonconductive material;
    a bottom barrier above the channel region;
    a floating gate above the bottom barrier, the floating gate covering the channel region and at least partially covering the nonconductive material on at least two sides of the floating gate, and at least partially covering the source and the drain;
    a top barrier above the floating gate;
    a dielectric layer comprising a material with a dielectric constant that is higher than that of the top barrier, the dielectric layer directly contacting the top barrier; and
    a control gate extending past and covering at least a portion of all sidewalls of the floating gate and a top surface of the floating gate, the control gate directly contacting the dielectric layer.

2. The non-volatile memory bitcell of claim 1, wherein the source and drain comprise a first conductivity type and the channel region comprises a second conductivity type.

3. The non-volatile memory bitcell of claim 1, wherein the top barrier and the bottom barrier are connected such that the floating gate is surrounded by a combination of the top and bottom barriers.

4. The non-volatile memory bitcell of claim 1, wherein each of the source and the drain comprises a lightly doped drain (LDD) implant region.

5. The non-volatile memory bitcell of claim 4, wherein the LDD implant region extends partway underneath the dielectric layer and the control gate.

6. The non-volatile memory bitcell of claim 4, wherein the LDD implant region extends partway underneath a spacer located on top of the substrate adjacent to the dielectric layer.

7. The non-volatile memory bitcell of claim 4, wherein the LDD implant region are self aligned to the control gate and the control gate is not self aligned to the floating gate.

8. The non-volatile memory bitcell of claim 1, wherein the substrate comprises a silicon on insulator (SOI) structure and wherein each of the source and the drain comprises a body region of opposite polarity to the channel region.

9. The non-volatile memory bitcell of claim 8, wherein the body region extends partway underneath the floating gate and is adjacent to the channel region.

10. The non-volatile memory bitcell of claim 1, wherein the substrate comprises a bulk silicon structure and wherein each of the source and the drain comprises a well region of opposite polarity to the channel region.

11. The non-volatile memory bitcell of claim 10, wherein the well region extends partway underneath the floating gate and is adjacent to the channel region.

12. The non-volatile memory bitcell of claim 1, wherein a surface area of the floating gate over the shallow trench isolation is such that a capacitance between the floating and the control gate is between 60% and 90%, inclusive.

13. The non-volatile memory bitcell of claim 1, wherein the control gate is a metal replacement gate.

14. The non-volatile memory bitcell of claim 1, wherein the control gate is thicker than the floating gate.

15. The non-volatile memory bitcell of claim 1, wherein the dielectric layer in the non-volatile memory bitcell is also used in a MOSFET with a maximum operating voltage below 1.5V.

16. The non-volatile memory bitcell of claim 1, wherein a majority of charge carriers in the channel region are placed there by implantation through the floating gate.

17. A non-volatile memory bitcell comprising:
    a substrate comprising a source, a drain, and a channel region between the source and drain;
    a bottom barrier above the channel region;
    a floating gate above the bottom barrier, the floating gate covering the channel region, a top surface of the floating gate being substantially planar, the floating gate comprising two lateral sides at least partially covering the source and the drain;
    a top barrier above the floating gate, the top barrier having lateral sides that contact the bottom barrier and surround the lateral sides of the floating gate that at least partially cover the source and the drain;
    a dielectric layer directly contacting the top barrier, the dielectric layer comprising a material with a dielectric constant that is higher than that of the top barrier; and
    a control gate directly contacting at least a portion of the dielectric layer and narrower in width than a width of the top barrier along an axis passing through the source, drain, and channel region, the control gate at least partially surrounded by the dielectric layer.

18. The non-volatile memory bitcell of claim 17, wherein each of the source and the drain comprises a halo implant region.

19. The non-volatile memory bitcell of claim 18, wherein the halo implant region extends partway underneath the bottom barrier.

20. The non-volatile memory bitcell of claim 17, wherein each of the source and the drain comprises a lightly doped drain (LDD) implant region.

21. The non-volatile memory bitcell of claim 20 wherein the LDD implant region extends partway underneath a spacer located on top of the substrate adjacent to the bottom barrier.

22. The non-volatile memory bitcell of claim 17, wherein the floating gate extends partway over a shallow trench isolation consisting of a non-conductive material.

23. The non-volatile memory bitcell of claim 22, wherein a surface area of the floating gate over the shallow trench isolation is such that a capacitance between the floating and the control gate is at least 60%.

24. The non-volatile memory bitcell of claim 17, further comprising spacers adjacent to portions of the top and bottom barriers surrounding the lateral sides of the floating gate extending over the source and drain.

25. A non-volatile memory bitcell comprising:
    a substrate comprising a source, a drain, and a channel region;
    a nonconductive material;
    a bottom barrier above the channel region;
    a floating gate above the bottom barrier, the floating gate covering the channel region and at least partially covering the nonconductive material on at least two sides of the floating gate, and at least partially covering the source and the drain;
    a top barrier above the floating gate;
    a dielectric layer comprising a material with a dielectric constant that is higher than that of the top barrier, the dielectric layer directly contacting the top barrier;

a control gate extending past and covering at least a portion of all sidewalls of the floating gate and a top surface of the floating gate, the control gate directly contacting the dielectric layer; and
at least one from group consisting of the bottom barrier, the top barrier, and the dielectric layer positioned between a portion of the control gate and the source and the drain.

* * * * *